(12) United States Patent
Suzuki

(10) Patent No.: US 6,359,818 B2
(45) Date of Patent: Mar. 19, 2002

(54) APPARATUS FOR ANALYZING FAILURE FOR SEMICONDUCTOR MEMORY DEVICE

(75) Inventor: Masahito Suzuki, Kawasaki (JP)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 09/726,615

(22) Filed: Dec. 1, 2000

(30) Foreign Application Priority Data

Jul. 14, 2000 (JP) ........................................ 2000-214821

(51) Int. Cl.[7] ................................................ G11C 7/00
(52) U.S. Cl. .................................... 365/201; 365/189.12
(58) Field of Search ........................... 365/201, 189.12; 371/21.1

(56) References Cited

U.S. PATENT DOCUMENTS

| | | | | |
|---|---|---|---|---|
| 5,383,195 A | * | 1/1995 | Spence et al. ............. 371/22.5 |
| 5,568,437 A | * | 10/1996 | Jamal ........................ 365/201 |
| 5,675,545 A | * | 10/1997 | Madhavan et al. ......... 365/201 |
| 5,946,247 A | * | 8/1999 | Osawa et al. ............... 365/201 |
| 5,961,653 A | * | 10/1999 | Kalter et al. .................... 714/7 |
| 6,006,347 A | * | 12/1999 | Churchill et al. ........... 714/724 |
| 6,243,307 B1 | * | 6/2001 | Kawagoe ..................... 365/201 |

* cited by examiner

Primary Examiner—Richard Elms
Assistant Examiner—Anh Phung
(74) Attorney, Agent, or Firm—Arent Fox Kintner Plotkin & Kahn, PLLC

(57) ABSTRACT

Failure determination of a memory is made in sequence based on address information supplied to the memory using a test circuit built inside the memory, and resultant failure determination information output from a comparator circuit and the address information output from an address counter circuit are fetched in sequence and held in a logic scan chain, whereby the logic scan chain which is originally provided for a logic test is efficiently used also for a memory test so as to obtain information concerning one or more failure locations and the number of failures by one BIST test without addition of a complicated circuit configuration.

12 Claims, 7 Drawing Sheets

APPARATUS FOR ANALYZING FAILURE FOR SEMICONDUCTOR MEMORY DEVICE

BACKGROUND OF THE INVENTION

1. Field of the Invention

The present invention relates to an apparatus for analyzing a failure for a semiconductor memory device.

2. Description of the Related Art

Conventionally, a memory test method using BIST (Built-in Self Test) has been widely used as a method for analyzing a failure of a memory for a semiconductor memory device or the like. The BIST is a test in which a test pattern is previously made inside a semiconductor chip and a test is conducted on all the memory cells in the chip using the test pattern, and whether or not there is a failure on the memory is output as information indicative of PASS or FAIL to the outside of the semiconductor chip.

The employment of such a test method by the BIST provides a merit of capability of conducting a memory test at a high speed. However, there is a problem that information obtained only concerns whether or not there is trouble on the memory, and it is impossible to obtain any information concerning where the trouble exists on the memory cell, at how many locations the trouble exists.

It is possible to specify the failure locations and the number of failures of the memory cells by adding registers for holding trouble information in accordance with the memory cells to a BIST circuit. However, this considerably increases the circuit size of the BIST. Thus, the larger BIST circuit is required to obtain the more pieces of trouble information. If no trouble occurs, the circuit which have been added to hold trouble information become needless.

FIG. 1 is a block diagram showing a configuration of a conventional memory BIST circuit including registers for holding trouble information as described above. As shown in FIG. 1, the memory BIST circuit comprises an address counter circuit 101 for outputting address information to specify a memory cell in a memory (RAM) 100, a data generator circuit 102 for generating an expected value of a test result, a comparator circuit 103 for comparing the output signal of the memory 100 with the expected value and determining whether the memory 100 is good or bad, and a BIST controller circuit 104 for controlling the state of the memory BIST operation.

The address counter circuit 101, the data generator circuit 102, and the comparator circuit 103 are individually controlled by the BIST controller circuit 104. The comparator circuit 103 has a function capable of holding the comparison result in a register by every bit-line. Therefore, an inspection of the state of the register makes it possible to specify at least failures on each bit-line. However, there is a problem that the failure location can not be specified in more detail because of the absence of a function of holding address information.

Meanwhile, a test method is conducted in which the output signals of all the memory cells and test addresses are output to an external terminal of the semiconductor chip and input to an exclusive memory tester or the like to be examined, but the problem thereof is impossibility of a test on the memory operating at a high speed. In other words, since the operating speed of the memory tester is low relatively to the operating speed of the memory, there is a limit to a test on a recent high speed memory by the exclusive memory tester.

A product mounting a plurality of memories on a semiconductor chip requires many selector circuits in order to give output signals of all the memory cells to an external terminal of the semiconductor chip. Therefore, the test circuit for the entire product increases in size, besides, there is a problem that the propagation speed of a signal decreases to affect the system operating speed of the product.

For the above reason, a failure analysis using the BIST method is performed as follows under the present circumstances. First, a memory test is conducted by the BIST method to determine the presence or absence of trouble on a memory subjected to the test. In this determination method, the memory output signal is compared with a previously prepared expected value, and when both values disagreement with each other, the register is allowed to store information indicative of "presence of trouble," and the information is output to the external terminal. The information thus obtained indicates only the presence or absence of occurrence of trouble.

When the occurrence of trouble is recognized, a failure analysis is then performed. In this failure analysis, the BIST operation is performed, and then the BIST operation is suspended when a trouble occurrence pattern is found. The circuit state is set such that information indicative of the failure location (bit-line/word-line information) at that time is output to the external terminal, thereby obtaining failure information.

However, in such a test method, it is necessary to repeat the BIST operation and the failure information detection operation to obtain the full failure information for a memory having a plurality of failures. Thus, sequentiality of the BIST operation is lost, resulting in the case in which the test result differs from the initial test result at the time of examining the presence or absence of trouble. Further, since it is not recognized in which pattern the trouble occurs, the BIST operation needs to be carried out to the last pattern to obtain the trouble information, which brings about a problem that it takes much time to detect the failure information.

SUMMARY OF THE INVENTION

The present invention is made to solve the above problems and its object is to specify the presence or absence, locations, the number, and the like, of failures, by one BIST test without addition of a complicated circuit configuration and to reduce considerably the processing time required for a memory test.

In an apparatus for analyzing a failure for a semiconductor memory device of the present invention, failure determination of the inside of the semiconductor memory device is made in sequence based on address information supplied to the semiconductor memory device using a test circuit of the semiconductor memory device, and resultant output failure determination information and the address information are fetched and held in a scan register circuit. This scan register circuit is made by using an originally provided logic scan circuit used at the time of conducting a test on a logic circuit other than the semiconductor memory device, and adding a function capable of obtaining failure determination result information thereto.

The present invention comprises the above-described technical means, thereby making it possible to use efficiently the scan register circuit originally existing for a logic test also for a memory test thereby to hold the failure determination result information detected upon the test of the semiconductor memory device in sequence into the scan register circuit with the address information. Accordingly, even if the present invention does not include an addition of a complicated circuit configuration, it becomes unnecessary to repeat processing of suspending the test operation at every detection of failure to specify the failure location, and it becomes possible to obtain information concerning one or more failure locations and the number of failures into the scan register circuit by one test.

Consequently, it is possible to obtain information concerning one or more failure locations and the number of failures by one test without addition of a complicated circuit configuration and to reduce considerably the processing time required for a memory test.

DETAILED DESCRIPTION OF THE PREFERRED EMBODIMENT

Hereinafter, an embodiment of the present invention will be explained with reference to drawings.

Figure 1:
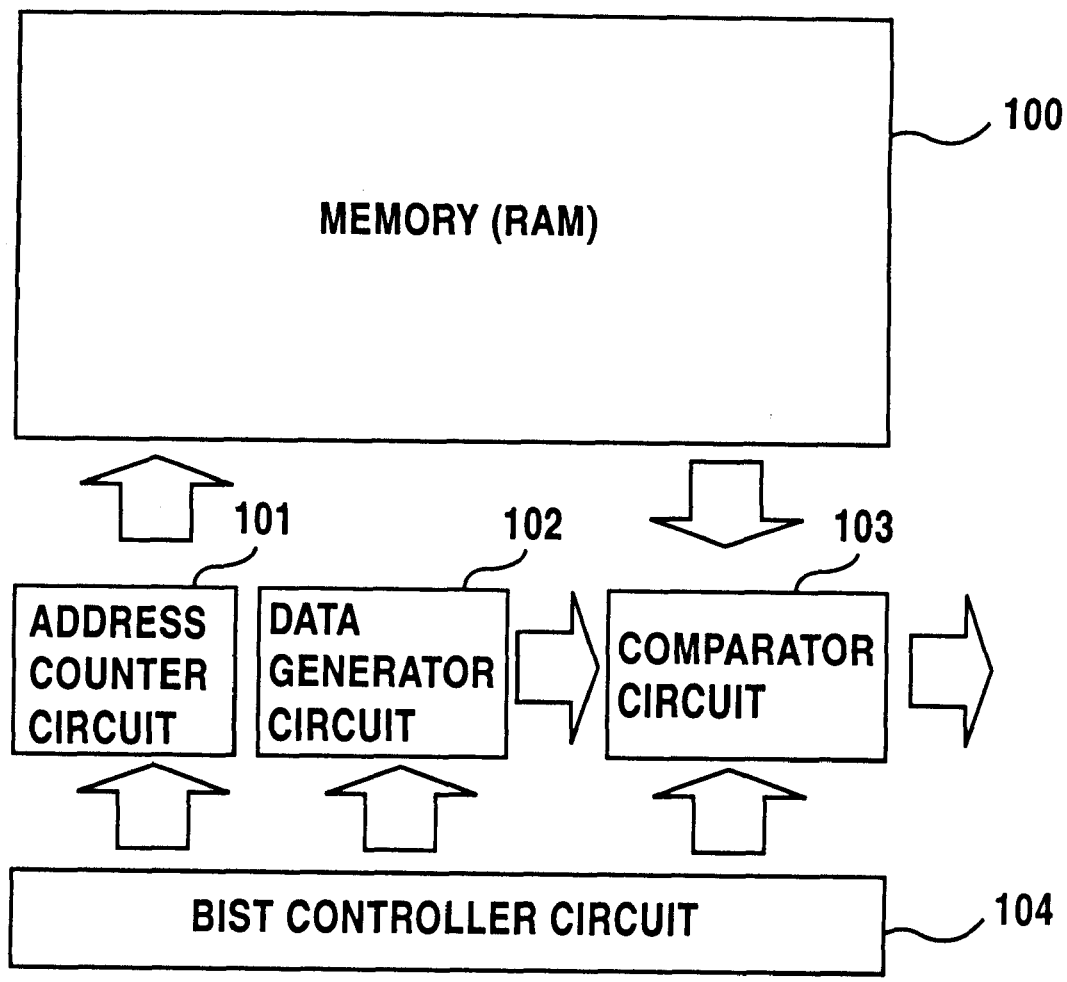
FIG. 1 is a block diagram showing the configuration of a conventional memory BIST circuit.
Figure 2:
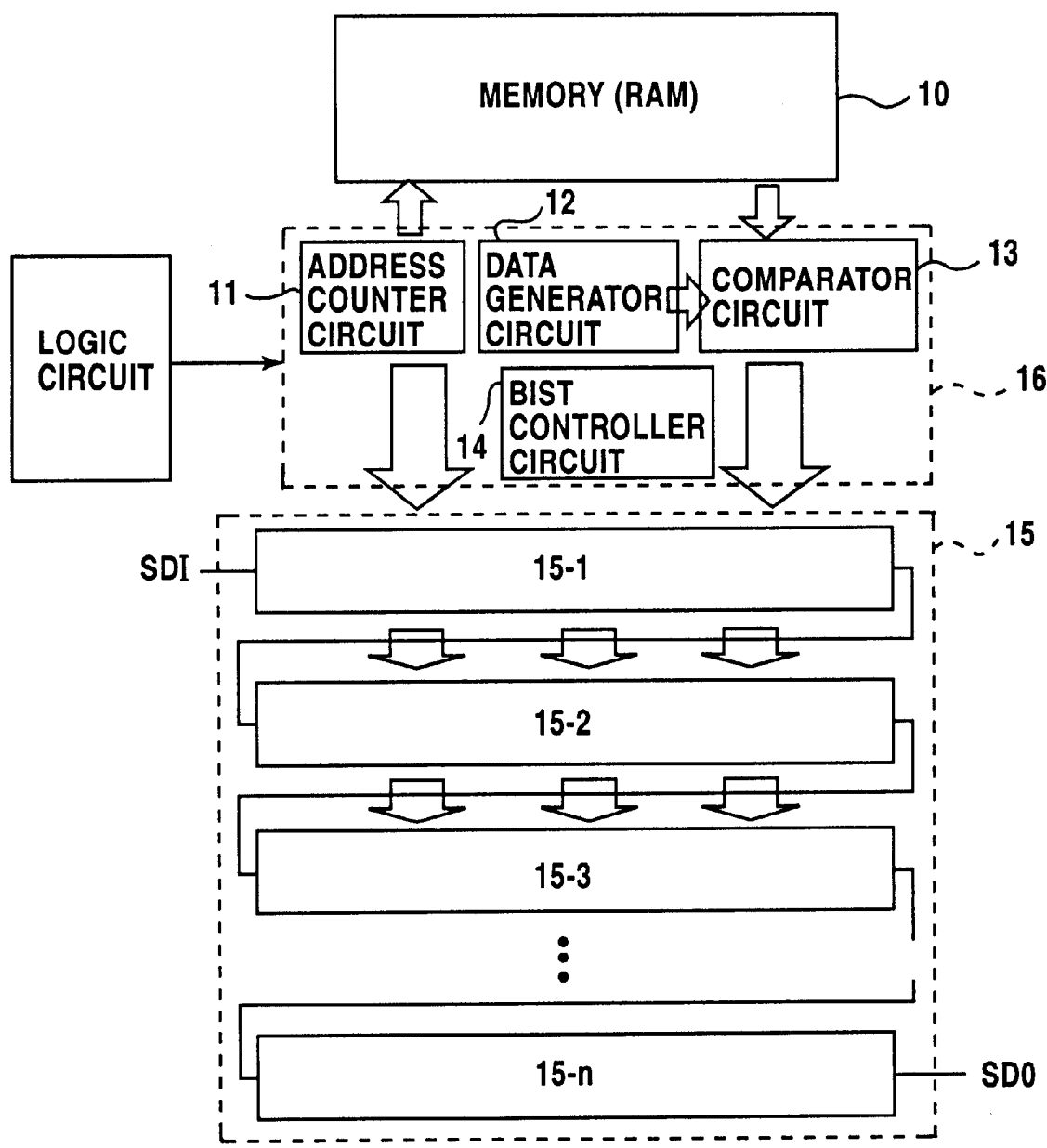
FIG. 2 is a block diagram showing an example of configuration of an apparatus for analyzing a failure for a semiconductor memory device according to an embodiment of the present invention.

FIG. 2 is a block diagram showing an example of configuration of an apparatus for analyzing a failure for a semiconductor memory device according to an embodiment of the present invention.

In FIG. 2, a memory BIST circuit 16 according to this embodiment comprises an address counter circuit 11, a data generator circuit 12, a comparator circuit 13, and a BIST controller circuit 14. The address counter circuit 11 outputs address information for specifying a memory cell in a memory (RAM) 10. The data generator circuit 12 generates an expected value of a test result.

The comparator circuit 13 compares a signal output from the memory 10 based on the address information with the expected value output from the data generator circuit 12 at every read pattern to determine whether the memory 10 is good or bad. The BIST controller circuit 14 controls the state of memory BIST operation. The above-described address counter circuit 11, data generator circuit 12, and comparator circuit 13 are individually controlled by the BIST controller circuit 14.

A logic scan chain 15 comprises scan flip-flops. The logic scan chain 15 is divided into a plurality of shift registers 15-1, 15-2, . . . , and 15-n. Each of the divided shift At registers 15-1, 15-2, . . . , and 15-n comprises substantially the same number of registers as that of memory cells existing on one bit-line (for example, 72 cells).

This logic scan chain 15 is configured to be originally provided to improve a failure detectivity at the time of conducting a test on a logic part (not shown) other than the memory 10, and the originally provided configuration is thus used for a memory test in this embodiment.

At the time of conducting a normal logic test, the respective shift registers 15-1, 15-2, . . . , and 15-n perform shift operations in an X-direction (a lateral direction in the drawing). In contrast to this, at the time of conducting a memory test, they perform shift operations in a Y-direction (a vertical direction in the drawing). In this embodiment, a configuration for allowing performance of the shift operations also in the Y-direction is added to the existing configuration that the logic scan chain 15 includes. The detail of this will be described later.

When conducting a memory test by the BIST by means of the failure analyzing apparatus configured as described above, the logic scan chain 15 activates the shift register in the Y-direction. At this time, the address information output from the address counter circuit 11 and the failure determination result information on the memory 10 (failure determination information on each memory cell connected to one bit-line) output from the comparator circuit 13 are output all the time to the shift register 15-1 at the first stage in the logic scan chain 15.

In this case, as a result of conducting the BIST test on the bit-line indicated by a piece of address information, when there is no problem in the respective memory cells on the bit-line, the failure determination result information indicative of all values being "0" is output to the shift register 15-1 at the first stage. When there is a problem in any one of the memory cells on the bit-line, the failure determination result information indicative of the value of the corresponding part to the memory cell being "1" is output to the shift register 15-1 at the first stage.

When a failure is detected, a clock is generated which causes the logic scan chain 15 to operate, whereby the address information and the failure determination result information are fetched in the register. Even when one failure is detected, the memory test by the BIST is continuously conducted. When a plurality of failures are detected, the failure information stored in the registers is sequentially shifted in the Y-direction, as shifted from the shift register 15-1 at the first stage to the shift register 15-2 at the second stage, and from the shift register 15-2 at the second stage to the shift register 15-3 at the third stage, . . . This makes it possible to hold n pieces of failure information at the maximum in the shift registers 15-1, 15-2, . . . , and 15-n respectively.

Through the inspection of the result of the above BIST test, the state of information held in the respective shift registers 15-1, 15-2, . . . , and 15-n, the failure locations on the memory 10 can be identified in detail based on the address information. Moreover, it is also easy to know how many failures there are on the memory 10.

Figure 3:
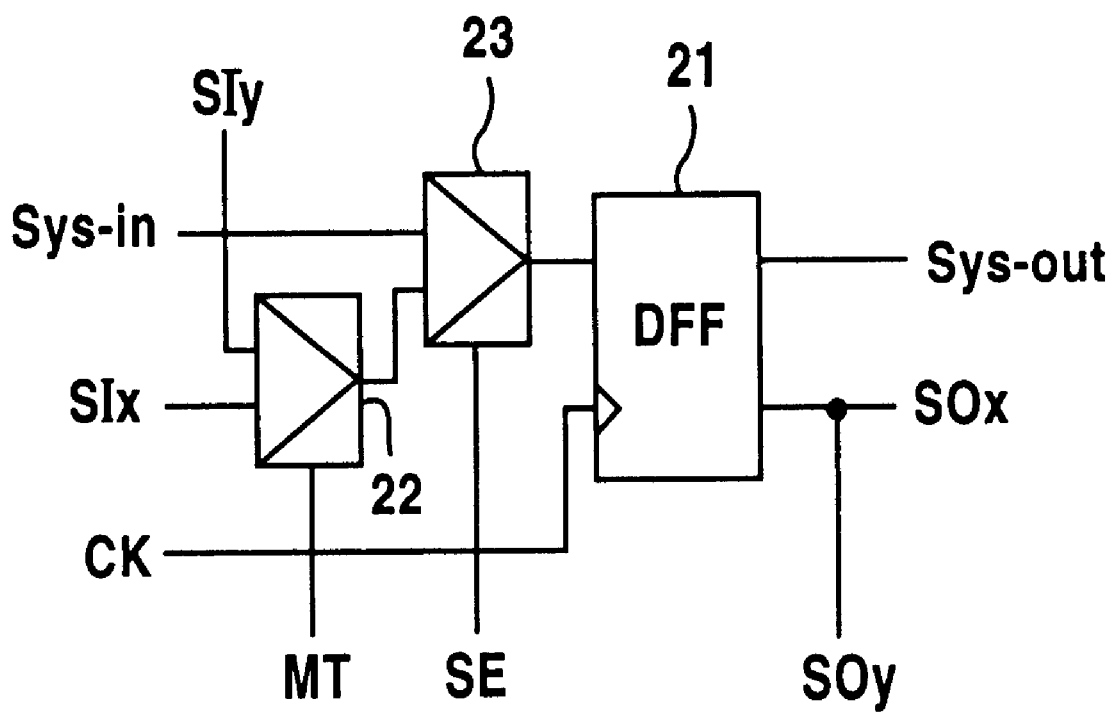
FIG. 3 is a block circuit diagram of a circuit configuration of one scan flip-flop composing a logic scan chain.

FIG. 3 is a block diagram showing a circuit configuration of one scan flip-flop making up the aforesaid logic scan chain 15.

Figure 4:
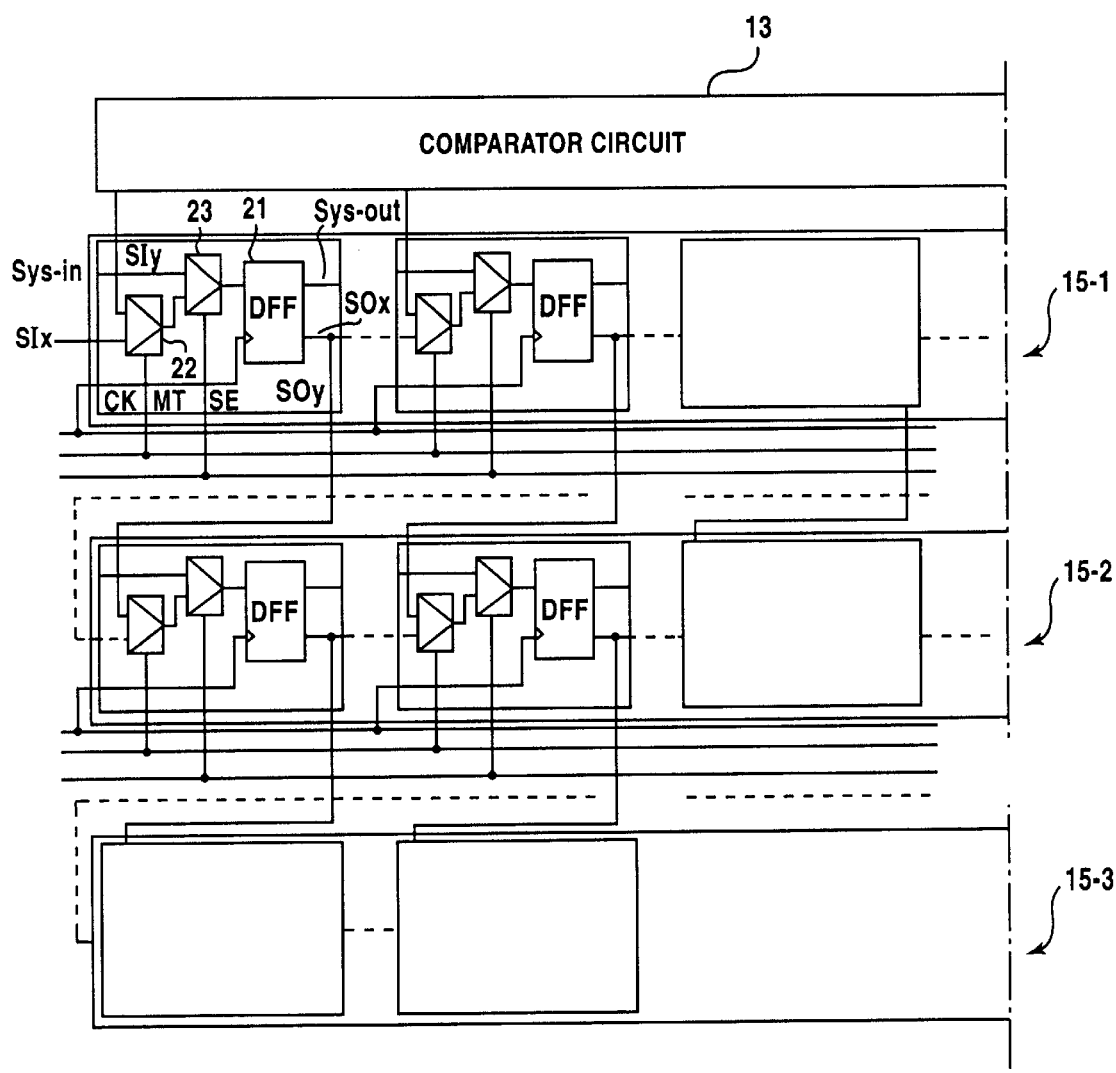
FIG. 4 is a block diagram showing a configuration of a register chain using the scan flip-flop shown in FIG. 3.

As shown in FIG. 3, a scan flip-flop comprises a D-type flip-flop (DFF) 21 and two selectors 22 and 23. Scan flip-flops each having the same configuration are arranged in a matrix form as shown in FIG. 4 to form the logic scan chain 15 shown in FIG. 2. In FIG. 4, dotted lines show the flows of scan operations in the X-direction used at the time of the logic test, and solid lines show the flows of scan operations in the Y-direction used at the time of the memory test.

In FIG. 3, provided are input terminals SIx and SIy of the scan chain, and output terminals SOx and SOy of the scan chain. A logic scan chain (shift operations in the X-direction) at the time of conducting a test on a not-shown logic part is realized by the input terminal SIx and the output terminal SOx. More specifically, information output from the output terminal SOx of a certain scan flip-flop is input to the input terminal SIx of the scan flip-flop at the next stage situated next thereto in the X-direction.

Further, the BIST state (shift operations in the Y-direction) at the time of conducting a test on the memory 10 is realized by the input terminal SIy and the output terminal SOy. More specifically, information output from the output terminal SOy of a certain scan flip-flop is input to the input terminal SIy of the scan flip-flop at the next stage situated next thereto in the Y-direction.

The selector 22 performs switching operation between the X-direction and the Y-direction as described above, on the basis of a memory test mode signal MT. More specifically, the information from the input terminal SIx in the X-direction and the information from the input terminal SIy in the Y-direction are input into the selector 22. The selector 22 selects either piece of information in accordance with the input memory test mode signal MT and outputs the selected piece of information to the selector 23.

The information selected by the selector 22 and information Sys-in which is provided during the normal system operation except for during the test time are input into the selector 23. The selector 23 selects either piece of information in accordance with an input select enable signal SE and outputs the selected piece of information to the DFF 21. The selector 23 selects the output information from the selector 22 at the time of the logic test or the memory test before shipment of the product and always selects the system information Sys-in after the shipment of the product.

As described above, the selector 22 is added to the selector 23 and the DFF 21 which are originally provided as components of the scan flip-flop, thereby making it possible to perform shift operations also in the Y-direction at the time of the memory test by the BIST in this embodiment.

The information selected at the selector 23 is held in the DFF 21 in accordance with a clock CK supplied to the DFF 21. The clock CK at the time of conducting the memory test by the BIST is generated in accordance with a failure flag generated based on the determination result of the BIST in the comparator circuit 13 in FIG. 2. A circuit for generating the failure flag is configured as in FIG. 5 by way of example.

Figure 5:
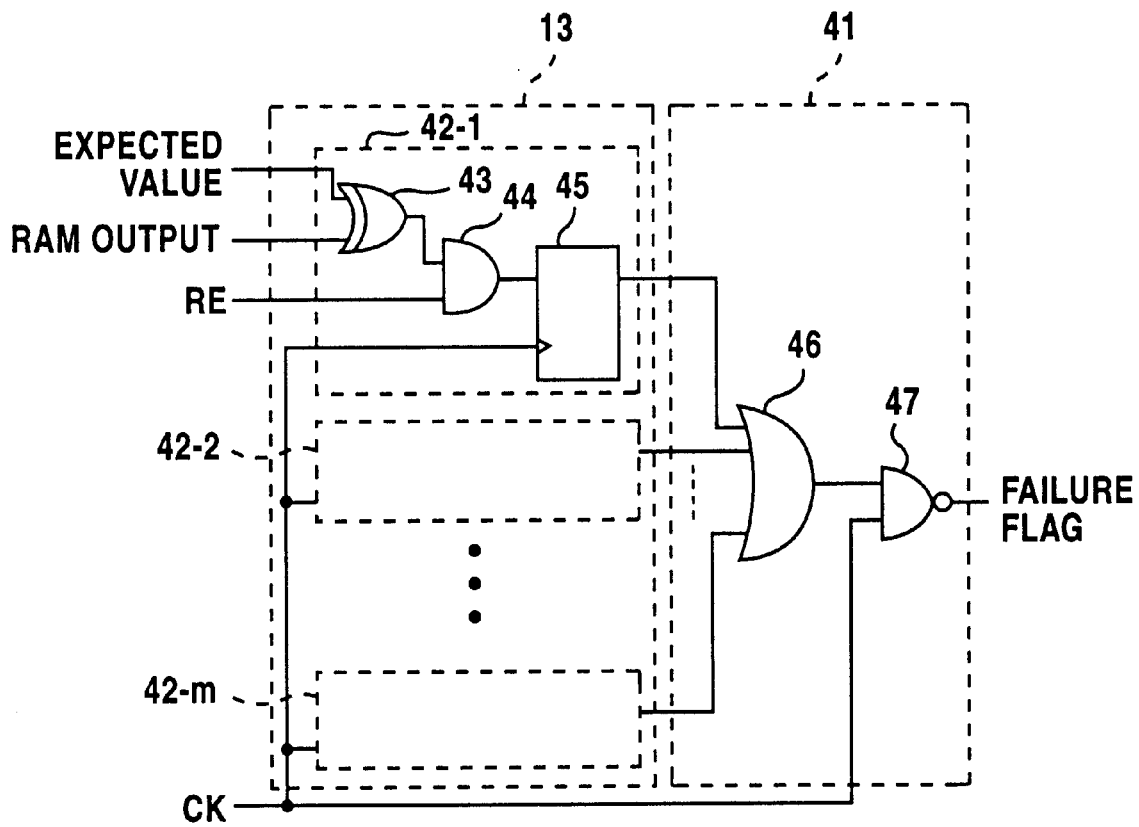
FIG. 5 is a block diagram showing an example of configuration of a failure flag generator circuit.

As shown in FIG. 5, a failure flag generator circuit 41 is added to the comparator circuit 13 shown in FIG. 2. The comparator circuit 13 includes comparison processing portions 42-1, 42-2, . . . , 42-m, the number of which is the same as that of the memory cells existing on one bit-line (for example, 72 cells). Each of the comparison processing portions 42-1, 42-2, . . . , 42-m is composed of an XOR circuit 43 with the output signal from the memory cell in the memory 10 and the expected value from the data generator circuit 12 as two inputs, an AND circuit 44 with the output signal from the XOR circuit 43 and a read enable signal RE as two inputs, and a register 45 for holding the output signal of the AND circuit 44 in accordance with the clock CK.

The read enable signal RE becomes "H" in the read state and "L" in the write state. Accordingly, when a disagreement between the signal read out from the memory cell of the memory 10 and the expected value is detected, the output signal of the register 45 becomes "H". Such failure determination operation is performed in the plurality of comparison processing portions 42-1, 42-2, . . . , 42-m individually, and all the results are input to the OR circuit 46 in the failure flag generator circuit 41.

Consequently, as a result of failure determination being individually made about the plurality of memory cells existing on some bit-line in the plurality of comparison processing portions 42-1, 42-2, . . . , 42-m, when a failure is found in any one of the memory cells, a signal "H" is output from the OR circuit 46. The output signal of the OR circuit 46 is input to the NAND circuit 47 with the clock CK, and the output signal of the NAND circuit 47 is output as the failure flag. Thus, a pulse in opposite phase to the clock CK is output as the failure flag.

Figure 6:
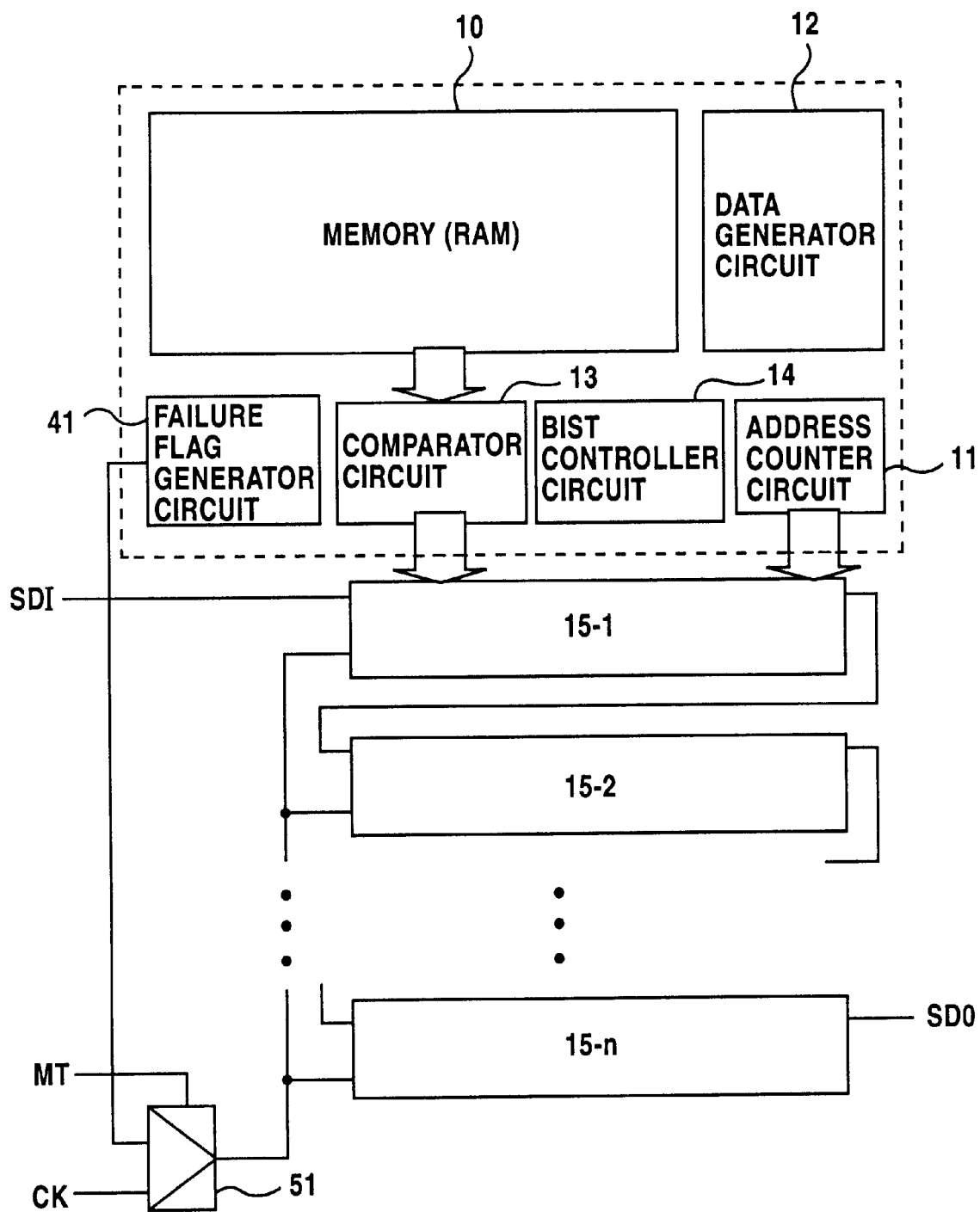
FIG. 6 is a block diagram for explaining a switching method between a clock used at the time of a logic scan and a clock used at the time of a memory scan by BIST.

The failure flag thus generated by the failure flag generator circuit 41 is used as an operation clock for the logic scan chain 15 shown in FIG. 2. A schematic block diagram in that case is shown in FIG. 6. FIG. 6 is a block diagram for explaining a switching method between a clock used at the time of the logic scan and a clock used at the time of the memory scan by the BIST and shows a configuration including the aforesaid failure flag generator circuit 41. Components in FIG. 6, to which the same numerals and symbols as those of the components in FIG. 2 are given, have the same functions, therefore the description thereof is omitted.

As shown in FIG. 6, either the failure flag output from the failure flag generator circuit 41 or the clock CK supplied from the outside is selected at a selector 51 in accordance with the memory test mode signal MT, and the selected signal is used as the operation clock for the logic scan chain 15. The clock CK supplied from the outside is supplied to the logic scan chain 15 at the time of the logic scan, and the failure flag is supplied as the operation clock CK to the logic scan chain 15 at the time of the memory scan.

Therefore, at the time of the memory scan, the logic scan chain 15 fetches failure information into the shift registers 15-1, 15-2, . . . , 15-n in sequence only when the failure is detected on the memory 10.

More specifically, when a failure is detected on a certain bit-line in the memory 10, the failure flag is output from the failure flag generator circuit 41, the address information output from the address counter circuit 11 and the failure determination result information output from the comparator circuit 13 are input to the shift register 15-1 at the first stage of the logic scan chain 15, and the failure determination result information is fetched by a rising edge of the failure flag.

When two failures are detected, the failure information held in the shift register 15-1 at the first stage is shifted to the shift register 15-2 at the second stage in synchronization with the rising edge of the failure flag, and new failure information is overwritten in the shift register 15-1 at the first stage. When three or more failures are detected, the failure information held in the register is shifted in the Y-direction in sequence in the same manner. Consequently, n pieces of failure information at the maximum are held in the shift registers 15-1, 15-2, . . . , 15-n.

After the completion of all the BIST operations, the memory test mode signal MT is switched to bring about the logic scan state, and holding results of the shift registers 15-1, 15-2, . . . , 15-n are output from an external SDO terminal and then examined, whereby the locations where failures occur and the number thereof can be precisely detected.

It should be noted that the case of one memory 10 has been explained in the aforesaid embodiment, but it is possible to conduct tests concurrently on a plurality of memories and collect failure information at once by changing the length of the logic scan chain 15.

Figure 7:
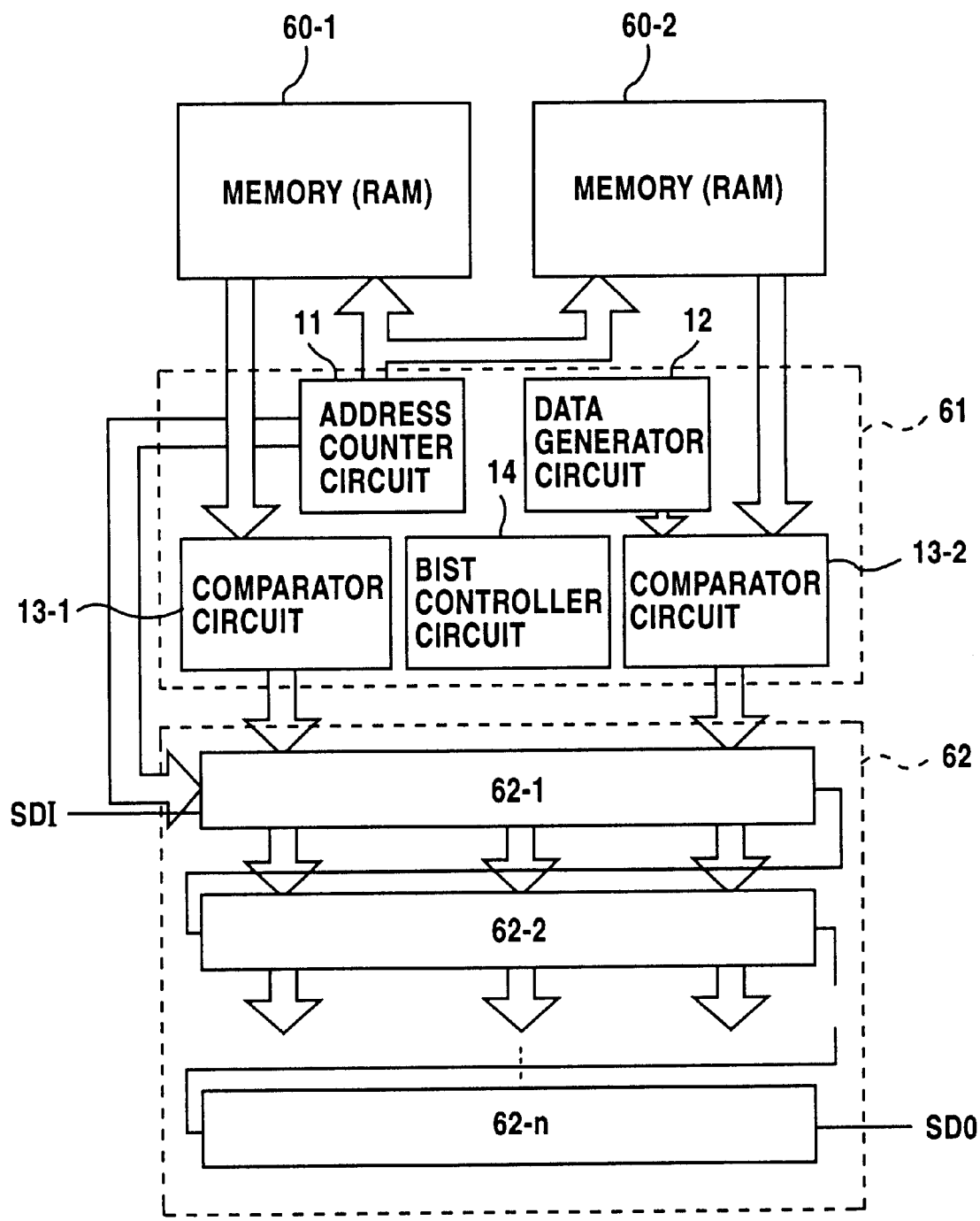
FIG. 7 is a block diagram showing another example of configuration of the apparatus for analyzing for a semiconductor memory device according to the embodiment.

FIG. 7 is a block diagram showing an example of configuration in the case in which tests are conducted concurrently on two memories 60-1 and 60-2. Components in FIG. 7, to which the same numerals and symbols as those of the components in FIG. 2 are given, have the same functions, and therefore the overlapping description thereof is omitted.

A memory BIST circuit 61 shown in FIG. 7 comprises an address counter circuit 11, a data generator circuit 12, two comparator circuits 13-1 and 13-2, and a BIST controller circuit 14. The address counter circuit 11 outputs the same address information to the two memories 60-1 and 60-2. In response to this, the memories 60-1 and 60-2 output information on the memory cells at designated the same address to the two comparator circuits 13-1 and 13-2. The comparator circuits 13-1 and 13-2 perform failure determination processing in parallel.

A logic scan chain 62 shown in FIG. 7 is divided into a plurality of shift registers 62-1, 62-2, . . . , 62-n. Each of the divided shift registers 62-1, 62-2, . . . , 62-n is composed of substantially the same number of registers as the total number of memory cells existing on one bit-line which are included in each of the two memories 60-1 and 60-2. In other words, supposing that each of the memories 60-1 and 60-2 has the same capacity as the memory 10 in FIG. 2, the number of registers included in the shift registers 62-1, 62-2, . . . , 62-n in FIG. 7 is twice the number of registers included in the shift registers 15-1, 15-2, . . . , 15-n in FIG. 2.

Also in the case of the configuration in FIG. 7, when a memory test by the BIST is conducted, the logic scan chain 62 activates the shift register in the Y-direction. At this time, the address information output from the address counter circuit 11 and the failure determination result information of the memories 60-1 and 60-2 output from the two comparator circuits 13-1 and 13-2 are output all the time to the shift register 62-1 at the first stage in the logic scan chain 62.

In this case, as a result of conducting the BIST test on the bit-line indicated by a certain piece of address information, when there is no problem in the respective memory cells on the bit-line, the failure determination result information indicative of all values being "0" is output to the shift register 62-1 at the first stage. When there is a problem in any one of the memory cells on the bit-line, the failure determination result information indicative of the value of the corresponding part to the memory cell being "1" is output to the shift register 62-1 at the first stage.

When a failure is detected, a clock is generated which causes the logic scan chain 62 to operate, whereby the address information and the failure determination result information are fetched in the register. Even when one failure is detected, the memory test by BIST is continuously conducted. When a plurality of failures are detected, the failure information stored in the register is sequentially shifted in the Y-direction, as shifted from the shift register 62-1 at the first stage to the shift register 62-2 at the second stage, and from the shift register 62-2 at the second stage to the shift register 62-3 at the third stage. This makes it possible to hold n pieces of failure information at the maximum in the shift registers 62-1, 62-2, . . . , and 62-n at the same time.

After the completion of all the BIST operations, the memory test mode signal MT is switched to bring about the logic scan state, and holding results of the shift registers 62-1, 62-2, . . . , 62-n are output from an external terminal SDO and then examined, whereby the locations where failures occur and the number thereof can be precisely detected in the two memories 60-1 and 60-2.

The aforesaid embodiments only show concrete examples for carrying out the present invention, and the technical range of the present invention is not intended to be interpreted in a narrow sense thereby. Therefore, the present invention may be carried out in various forms without departing from the spirit and the main features thereof.

What is claimed is:

1. An apparatus for analyzing a failure for a semiconductor memory device, said apparatus comprising:

a failure determination circuit for making failure determination of the inside of said semiconductor memory device based on supplied address information using a test circuit built in said semiconductor memory device; and a scan register circuit for holding failure determination result information output from said failure determination circuit and said address information;

wherein said scan register circuit includes selectors each for switching between a shift operation in a first direction and a shift operation in a second direction.

2. The apparatus for analyzing a failure for a semiconductor memory device according to claim 1, wherein said failure determination circuit comprises:

a data generator circuit for generating an expected value of the output signal from said semiconductor memory device; and a comparator circuit for comparing the output signal from said semiconductor memory device with the expected value output from said data generator circuit and outputting a result of agreement or disagreement as said failure determination result information.

3. The apparatus for analyzing a failure for a semiconductor memory device according to claim 2, wherein said comparator circuit comprises the same number of comparison processing circuits as that of memory cells on one bit-line of said semiconductor memory device, for comparing the output signals from a plurality of memory cells of said semiconductor memory device with the expected values output from said data generator circuit, respectively, and outputting results of agreement or disagreement, respectively.

4. The apparatus for analyzing a failure for a semiconductor memory device according to claim 1, wherein said scan register circuit is a logic scan register circuit used at the time of conducting a test on a logic circuit other than said semiconductor memory device.

5. The apparatus for analyzing a failure for a semiconductor memory device according to claim 1, wherein said scan register circuit includes a plurality of shift registers.

6. The apparatus for analyzing a failure for a semiconductor memory device according to claim 5, wherein said selector selects the shift operation in said first direction at the time of conducting a test on said logic circuit and selects the shift operation in said second direction at the time of conducting a test on said semiconductor memory device.

7. The apparatus for analyzing a failure for a semiconductor memory device according to claim 5, wherein said selector selects the shift operation in said first direction at the time of conducting a test on said logic circuit and selects the shift operation in said second direction at the time of conducting a test on said semiconductor memory device in accordance with a test mode selection signal for selecting which of the test on said logic circuit or the test on said semiconductor memory device is conducted.

8. The apparatus for analyzing a failure for a semiconductor memory device according to claim 2, further comprising:

a failure flag generator circuit for generating a failure flag and outputting said failure flag in synchronization with a test operation clock when disagreement is detected by said comparator circuit.

9. The apparatus for analyzing a failure for a semiconductor memory device according to claim 3, further comprising:

a failure flag generator circuit for generating a failure flag and outputting said failure flag in synchronization with a test operation clock when disagreement is detected by at least one of said comparator circuits.

10. The apparatus for analyzing a failure for a semiconductor memory device according to claim 8, wherein the failure flag output from said failure flag generator circuit is used as the operation clock for said scan register circuit.

11. The apparatus for analyzing a failure for a semiconductor memory device according to claim 8, further comprising:

a clock selector circuit for selecting either the failure flag output from said failure flag generator circuit or the clock signal supplied from the outside and outputting it as the operation clock for said scan register circuit in accordance with a test mode selection signal for selecting which of a test on a logic circuit other than said semiconductor memory device or a test on said semiconductor memory device is conducted.

12. The apparatus for analyzing a failure for a semiconductor memory device according to claim 1, wherein said failure determination circuits make failure determination of the inside of a plurality of semiconductor memory devices based on address information commonly supplied to said plurality of semiconductor memory devices, and wherein said scan register circuit holds in sequence failure determination result information about said plurality of semiconductor memory devices output from said failure determination circuits and said address information.

* * * * *